United States Patent
Nishikawa et al.

(10) Patent No.: US 8,889,568 B2
(45) Date of Patent: Nov. 18, 2014

(54) METHOD AND APPARATUS FOR PRODUCING SILICON NITRIDE FILM

(75) Inventors: Seiji Nishikawa, Tokyo (JP); Hidetaka Kafuku, Tokyo (JP); Tadashi Shimazu, Tokyo (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 0 days.

(21) Appl. No.: 13/638,213

(22) PCT Filed: May 18, 2011

(86) PCT No.: PCT/JP2011/061364
§ 371 (c)(1),
(2), (4) Date: Dec. 6, 2012

(87) PCT Pub. No.: WO2011/148831
PCT Pub. Date: Dec. 1, 2011

(65) Prior Publication Data
US 2013/0109154 A1   May 2, 2013

(30) Foreign Application Priority Data
May 28, 2010 (JP) ................. 2010-122251

(51) Int. Cl.
*H01L 21/31* (2006.01)
*H01L 21/469* (2006.01)
*C23C 16/505* (2006.01)
*H01L 21/67* (2006.01)
*C23C 16/34* (2006.01)
*H01J 37/32* (2006.01)
*H01L 21/02* (2006.01)

(52) U.S. Cl.
CPC ........ *H01L 21/02521* (2013.01); *C23C 16/505* (2013.01); *H01L 21/67017* (2013.01); *C23C 16/345* (2013.01); *H01J 37/32706* (2013.01); *H01L 21/02211* (2013.01); *H01J 37/32449* (2013.01); *H01L 21/0217* (2013.01); *H01L 21/02274* (2013.01); *H01L 21/0228* (2013.01)
USPC ............ 438/792; 257/E21.292; 257/E21.293; 438/791

(58) Field of Classification Search
USPC ............ 257/E21.292, E21.293; 438/791, 792
See application file for complete search history.

(56) References Cited

U.S. PATENT DOCUMENTS 5,243,202 A    9/1993  Mori et al.
6,355,943 B1   3/2002  Sung
(Continued)

FOREIGN PATENT DOCUMENTS

JP    2000-183359 A    6/2000
JP    2001-168090 A    6/2001
(Continued)

OTHER PUBLICATIONS

Extended European Search Report dated Nov. 12, 2013, issued in European Patent Application No. 11786530.3 (7 pages).
(Continued)

*Primary Examiner* — Asok K Sarkar
(74) *Attorney, Agent, or Firm* — Westerman, Hattori, Daniels & Adrian, LLP

(57) ABSTRACT

Disclosed are: a method for producing a silicon nitride film, wherein generation of blisters at the periphery of a substrate is suppressed when a silicon nitride film is formed through application of a bias power; and an apparatus for producing a silicon nitride film. Specifically disclosed are a method and apparatus for producing a silicon nitride film, wherein a silicon nitride film used for a semiconductor element is formed on a substrate by plasma processing. In the method and apparatus for producing a silicon nitride film, a bias is applied to the substrate at time (b1), and a starting material gas $SiH_4$ for the silicon nitride film is started to be supplied at time (b3) after the application of the bias.

6 Claims, 6 Drawing Sheets

(56) References Cited

U.S. PATENT DOCUMENTS

| | | |
|---|---|---|
| 2002/0079495 A1 | 6/2002 | Sung |
| 2004/0180536 A1 | 9/2004 | Fujiwara et al. |
| 2009/0163041 A1 | 6/2009 | Mungekar et al. |
| 2010/0236482 A1 | 9/2010 | Kafuku et al. |
| 2010/0310791 A1 | 12/2010 | Shimazu et al. |
| 2011/0254078 A1* | 10/2011 | Honda et al. ............ 257/324 |

FOREIGN PATENT DOCUMENTS

| | | |
|---|---|---|
| JP | 2001-244262 A | 9/2001 |
| JP | 2002-353215 A | 12/2002 |
| JP | 2002-368084 A | 12/2002 |
| JP | 2003-239071 A | 8/2003 |
| JP | 2008-198695 A | 8/2008 |
| JP | 2009-099897 A | 5/2009 |
| JP | 2009-177046 A | 8/2009 |
| WO | 2009/085974 A2 | 7/2009 |
| WO | 2009/096259 A1 | 8/2009 |

OTHER PUBLICATIONS

Translation of the International Preliminary Report on Patentability (PCT/ISA/237) (5 pages), (PCT/IB/373) (1 page) of International Application No. PCT/JP2011/061364 mailed Dec. 13, 2012 (Form PCT/IB/338) (1 page).

International Search Report of PCT/JP2011/061364, mailing date Jul. 5, 2011.

Japanese Decision to Grant a Patent dated Aug. 5, 2014, issued in Japanese Patent Application No. 2010-122251, w/English translation (6 pages).

* cited by examiner

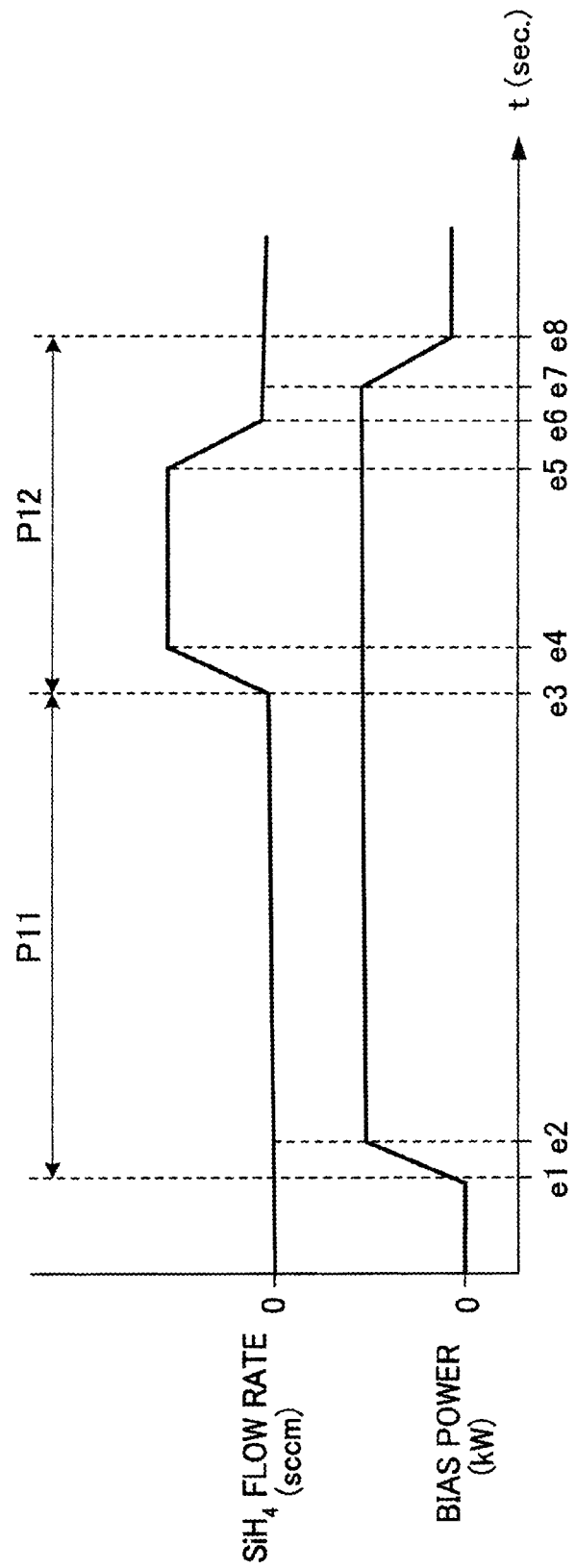

METHOD AND APPARATUS FOR PRODUCING SILICON NITRIDE FILM

TECHNICAL FIELD

The present invention relates to a method and an apparatus for producing a silicon nitride film to be used in a semiconductor element.

BACKGROUND ART

Plasma CVD methods and plasma CVD apparatuses have been known as methods and apparatuses for manufacturing a silicon nitride film used in a semiconductor element.

PRIOR ART DOCUMENTS

Patent Documents

Patent Document 1: Japanese Patent Application Publication No. 2009-177046
Patent Document 2: Japanese Patent Application Publication No. 2002-368084

SUMMARY OF THE INVENTION

Problems to be Solved by the Invention

Silicon nitride films (hereinafter, referred to as SiN films) have been used as the lenses of CCD (Charge-Coupled Device) and CMOS (Complementary Metal-Oxide Semiconductor) image sensors for their high refractive indexes and high transmittances, and also used as the final protective films of wirings for their barrier properties. Currently, due to the miniaturization of semiconductor elements, there have been increasing demands for embedding a SiN film in high-aspect-ratio minute holes (holes with a hole diameter: Φ of below 1 μm and an aspect ratio of 1 or above).

To embed a SiN film in high-aspect-ratio minute holes, it is necessary to perform that film formation by applying bias power. In Patent Document 1, the inventor of the present invention and others have already proposed a technique in which a SiN film is formed by using an appropriate process condition in the application of bias power to thereby reduce the film stress so that film detachment can be prevented. However, even when such a process condition is used, small blisters may develop in the periphery (the surface to bevel portions) of the substrate in some cases. As such blisters develop, the number of particles attributable to the blisters increase in the periphery of the substrate, thereby making it difficult for the SiN film to be applied to semiconductor elements which are strictly controlled in terms of particles.

The present invention has been made in view of the above problem, and an object thereof is to provide a method and an apparatus for producing a silicon nitride film which suppress the development of blisters in the periphery of a substrate when the silicon nitride film is formed by applying bias power.

Means for Solving the Problem

A method for producing a silicon nitride film according to a first aspect of the invention for solving the above problem is a method for producing a silicon nitride film to be used in a semiconductor element by performing plasma processing to form the silicon nitride film on a substrate, comprising the step of:

applying bias to the substrate,
starting supply of a raw material gas of the silicon nitride film after the application of the bias, and
starting a formation of the silicon nitride film.

A method for producing a silicon nitride film according to a second aspect of the invention for solving the above problem is the method for producing a silicon nitride film according to the first aspect of the invention, further comprising the step of:

forming a different silicon nitride film with supplying the raw material gas and without applying any bias to the substrate before the formation of the silicon nitride film, wherein
the supply of the raw material gas is once stopped when the formation of the different silicon nitride film is finished, and
the bias is applied and then the supply of the raw material gas is restarted for the formation of the silicon nitride film.

A method for producing a silicon nitride film according to a third aspect of the invention for solving the above problem is the method for producing a silicon nitride film according to the first aspect of the invention, further comprising the step of:

heating the substrate by plasma processing using an inert gas with applying the bias to the substrate before the formation of the silicon nitride film, wherein
the supply of the raw material gas is started for the formation of the silicon nitride film in a state where the bias is applied.

A method for producing a silicon nitride film according to a fourth aspect of the invention for solving the above problem is the method for producing a silicon nitride film according to any one of the first to third aspects of the invention, wherein at the moment of starting the formation of the silicon nitride film, power of the bias is held constant, and then the supply of the raw material gas is started.

A method for producing a silicon nitride film according to a fifth aspect of the invention for solving the above problem is the method for producing a silicon nitride film according to any one of the first to fourth aspects of the invention, wherein at the moment of finishing the formation of the silicon nitride film, the supply of the raw material gas is stopped, and then the application of the bias is stopped after a residual gas of the raw material gas is vented.

An apparatus for producing a silicon nitride film according to a sixth aspect of the invention for solving the above problem is an apparatus for producing a silicon nitride film to be used in a semiconductor element by performing plasma processing to form the silicon nitride film on a substrate, comprising:

bias supplying means for applying bias to the substrate; and
raw-material-gas supplying means for supplying a raw material gas of the silicon nitride film, wherein
the bias supplying means applies the bias to the substrate,
the raw-material-gas supplying means starts the supply of the raw material gas after the application of the bias, and then
a formation of the silicon nitride film is started.

An apparatus for producing a silicon nitride film according to a seventh aspect of the invention for solving the above problem is the apparatus for producing a silicon nitride film according to the sixth aspect of the invention, in a case that a different silicon nitride film is formed before the formation of the silicon nitride film by causing the raw-material-gas supplying means to supply the raw material gas in a state where the bias supplying means is applying no bias to the substrate,
the raw-material-gas supplying means once stops the supply of the raw material gas when the formation of the different silicon nitride film is finished, and the bias supplying means applies the bias to the substrate, and then the raw-material-gas supplying means restarts the supply of the raw material gas for the formation of the silicon nitride film.

An apparatus for producing a silicon nitride film according to an eighth aspect of the invention for solving the above problem is the apparatus for producing a silicon nitride film according to the sixth aspect of the invention, further comprising:

inert-gas supplying means for supplying an inert gas, wherein in a case that the substrate is heated by plasma processing using the inert gas before the formation of the silicon nitride film by causing the inert-gas supplying means to supply the inert gas in a state where the bias supplying means is applying the bias to the substrate, the raw-material-gas supplying starts the supply of the raw material gas for the formation of the silicon nitride film in a state where the bias supplying means is applying the bias to the substrate.

An apparatus for producing a silicon nitride film according to a ninth aspect of the invention for solving the above problem is the apparatus for producing a silicon nitride film according to any one of the sixth to eighth aspects of the invention, wherein at the moment of starting the formation of the silicon nitride film, the bias supplying means holds power of the bias constant, and then the raw-material-gas supplying means starts the supply of the raw material gas.

An apparatus for producing a silicon nitride film according to a tenth aspect of the invention for solving the above problem is the apparatus for producing a silicon nitride film according to any one of the sixth to ninth aspects of the invention, wherein at the moment of finishing the formation of the silicon nitride film, the raw-material-gas supplying means stops the supply of the raw material gas, and then the bias supplying means stops the application of the bias after a residual gas of the raw material gas is vented.

Effects of the Invention

According to the first and sixth aspects of the invention, in the formation of the silicon nitride film by applying the bias, the bias is applied, and then the supply of the raw material gas is started. Thus, the silicon nitride film can avoid being formed in a state where the bias power is low. Accordingly, it is possible to avoid increase in film stress and hence to suppress the development of blisters and film detachment in the periphery of the substrate. As a result, particles can be reduced.

According to the second and seventh aspects of the invention, before the formation of the silicon nitride film by applying the bias, the silicon nitride film involving no bias application is formed, and in the formation of the silicon nitride film by applying the bias, the bias is applied, and then the supply of the raw material gas is started. Thus, the silicon nitride film involving no bias application can be inserted under the silicon nitride film involving bias application as a layer being in tight contact therewith. Moreover, the silicon nitride film can avoid being formed in a state where the bias power is low. Accordingly, it is possible to avoid increase in film stress and hence to suppress the development of blisters and film detachment in the periphery of the substrate. As a result, particles can be reduced.

According to the third and eighth aspects of the invention, before the formation of the silicon nitride film by applying the bias, the substrate is heated by the plasma processing with the inert gas, and in the formation of the silicon nitride film by applying the bias, the supply of the raw material gas is started in a state where the bias is applied. Thus, by performing the heating process on the substrate in advance to release residual gas, gas release from the substrate during the supply of the raw material gas (during the film formation) can be suppressed, and also the silicon nitride film can avoid being formed in a state where the bias power is low. Accordingly, it is possible to avoid increase in film stress and hence to suppress the development of blisters and film detachment in the periphery of the substrate. As a result, particles can be reduced.

According to the fourth and ninth aspects of the invention, in the formation of the silicon nitride film by applying the bias, the power of the applied bias is held constant, and then the supply of the raw material gas is started. Thus, the silicon nitride film can more certainly avoid being formed in a state where the bias power is low. Accordingly, it is possible to more certainly avoid increase in film stress and hence to more certainly suppress the development of blisters and film detachment in the periphery of the substrate. As a result, particles can be more certainly reduced.

According to the fifth and tenth aspects of the invention, the supply of the raw material gas is stopped, the residual gas of the raw material gas is vented, and then the application of the bias is stopped. Thus, the film formation of a silicon nitride film having a poor film quality due to the residual raw material gas is prevented. Accordingly, it is possible to avoid increase in film stress and hence to suppress the development of blisters and film detachment in the periphery of the substrate. As a result, particles can be reduced.

BRIEF DESCRIPTION OF THE DRAWINGS

FIG. 6 is time chart describing still another illustrative embodiment (Example 3) of the method for manufacturing a silicon nitride film according to the present invention.

MODES FOR CARRYING OUT THE INVENTION

Hereinbelow, a method and an apparatus for manufacturing a silicon nitride film (SiN film) according to the present invention will be described through embodiments with reference to FIGS. 1 to 6.

Example 1

First, the configuration of an apparatus used in this example to manufacture a SiN film will be described with reference to FIG. 1. Note that the present invention is applicable to any apparatuses as long as they are plasma processing apparatuses which form a SiN film by applying bias power.

Figure 1:
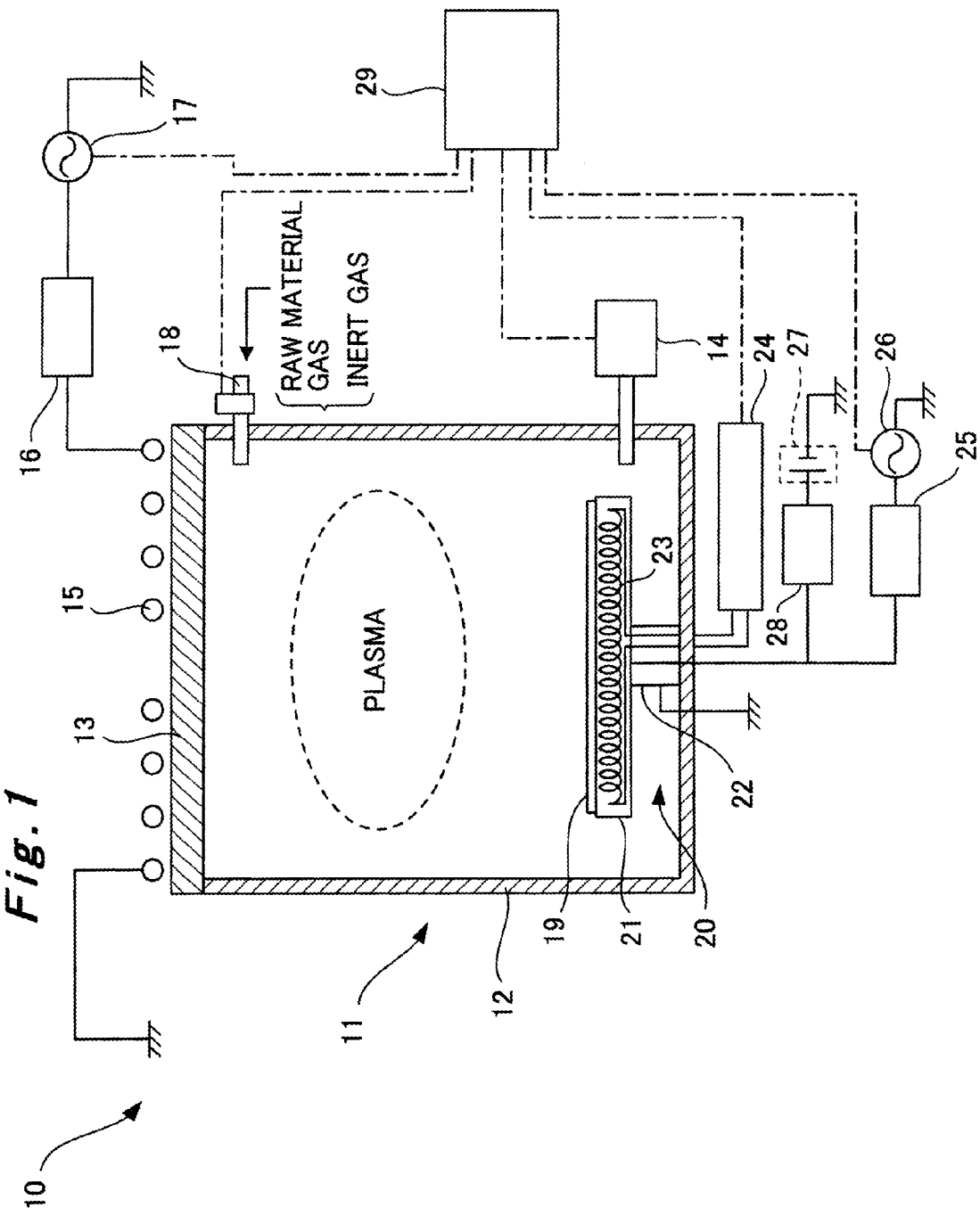
FIG. 1 is a configuration diagram showing an illustrative embodiment (Example 1) of an apparatus for manufacturing a silicon nitride film according to the present invention.

However, plasma CVD apparatuses using high-density plasma are preferable in particular, and FIG. 1 illustrates such a plasma CVD apparatus.

As shown in FIG. 1, a plasma CVD apparatus 10 includes a vacuum chamber 11 configured to maintain a high vacuum therein. This vacuum chamber 11 is formed of a tubular container 12 and a top panel 13, and a space tightly sealed from outside air is created by attaching the top panel 13 to an upper portion of the tubular container 12. On the vacuum chamber 11, a vacuum device 14 configured to vacuum the inside of the vacuum chamber 11 is placed.

An RF antenna 15 configured to generate plasma is placed on top of the top panel 13. An RF power source 17 being a high-frequency power source is connected to the RF antenna 15 through a matching box 16. Specifically, the RF power supplied from the RF power source 17 is supplied to plasma through the RF antenna 15.

In an upper portion of a sidewall of the tubular container 12, there is placed a gas supply pipe 18 through which raw material gases serving as raw materials for a film to be formed and an inert gas are supplied into the vacuum chamber 11. A gas supply amount controller (raw-material-gas supplying means, inert-gas supplying means) configured to control the amounts of the raw material gases and the inert gas to be supplied is placed on the gas supply pipe 18. In this example, $SiH_4$ and $N_2$, or the like are supplied as the raw material gases, while Ar which is a noble gas or the like is supplied as the inert gas. By supplying these gases, plasma of $SiH_4$, $N_2$ and Ar, or the like is generated in an upper portion of the inside of the vacuum chamber 11.

A substrate support table 20 configured to hold a substrate 19, or the film formation target, is placed in a lower portion of the inside of the tubular container 12. This substrate support table 20 is formed of a substrate holding part 21 configured to hold the substrate 19, and a support shaft 22 configured to support this substrate holding part 21. A heater 23 for heating is placed inside the substrate holding part 21. The temperature of this heater 23 is adjusted by a heater control device 24. Accordingly, the temperature of the substrate 19 during plasma processing can be controlled.

A bias power source 26 (bias supplying means) is connected to the substrate holding part 21 through a matching box 25 so that bias power can be applied to the substrate 19. Accordingly, ions can be drawn from the inside of the plasma onto the surface of the substrate 19. Further, an electrostatic power source 27 is connected to the substrate holding part 21 so that the substrate 19 can be held by electrostatic force. This electrostatic power source 27 is connected to the substrate holding part 21 through a low-pass filter 28 so that the power from the RF power source 17 and the bias power source 26 does not flow into the electrostatic power source 27.

In addition, in the plasma CVD apparatus 10 described above, there is placed a master control device 29 capable of controlling each of the bias power, the RF power, the pressure, the substrate temperature, and the gas supply amounts respectively through the bias power source 26, the RF power source 17, the vacuum device 14, the heater control device 24, and the gas supply amount controller. Here, the dashed lines in FIG. 1 mean signal lines to transmit control signals from the master control device 29 to the bias power source 26, the RF power source 17, the vacuum device 14, the heater control device 24, and the gas supply amount controller, respectively.

A SiN film can be formed on the substrate 19 through plasma processing in the plasma CVD apparatus 10 described above by controlling the bias power, the RF power, the pressure, the film formation temperature, and the gas supply amounts through the master control device 29.

Now, a conventional method for manufacturing a SiN film and a problem therein will be described with reference to the time chart in FIG. 2. Note that although FIG. 2 shows only the $SiH_4$ flow rate and the bias power, the gases other than the $SiH_4$, such as the $N_2$ and the Ar, and the RF power are supplied prior to the film formation for generating plasma.

Figure 2:
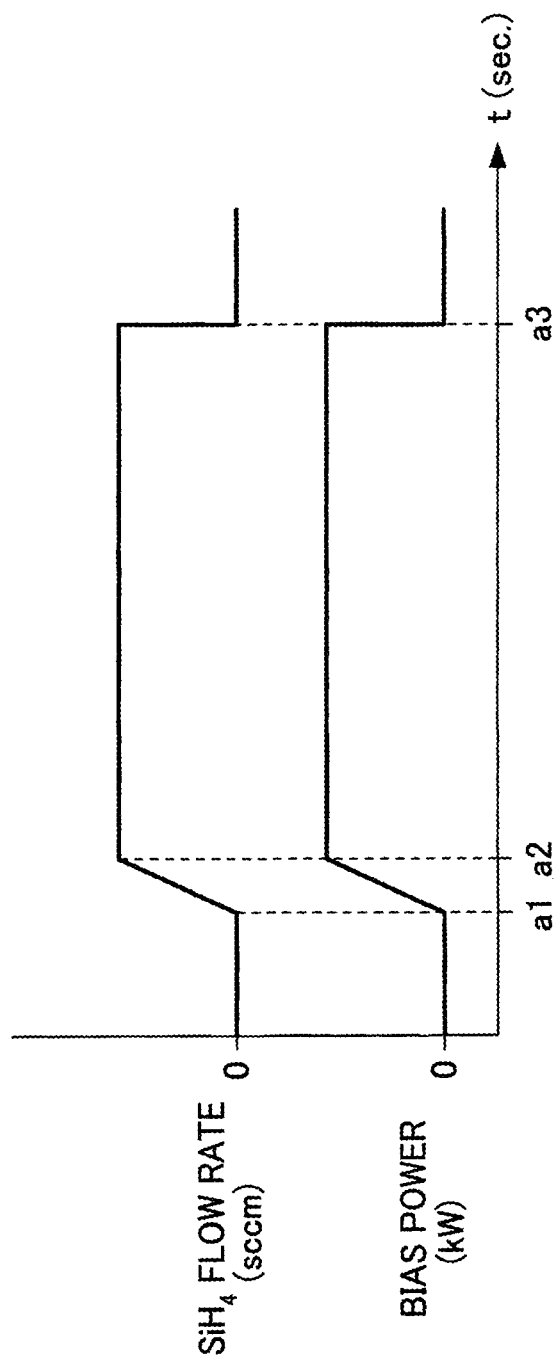
FIG. 2 is a time chart describing a conventional method for manufacturing a silicon nitride film.

As shown in FIG. 2, in the conventional method for manufacturing a SiN film, the supplies of the $SiH_4$ and the bias power are started at the same timing (time a1) and start to be held at their respective constant levels at the same timing (time a2), and then the supplies are stopped at the same timing (time a3). In reality, however, small time differences are present between them. Specifically, small time differences are present between them due to delays of the control signals, the influence of the piping's length on the $SiH_4$ flow rate, and the like.

When a SiN film is formed in a state where the bias power is low, the film stress therein increases, thereby leading to a problem of causing film detachment. When the bias power is applied with a delay after the $SiH_4$, this is exactly when the SiN film is formed in a state where the bias power is low. As a result, the film stress in the SiN film increases, thereby causing the development of blisters and the occurrence of film detachment.

Meanwhile, at the moment of applying the bias power, distribution of the bias power occurs within the surface of the substrate, and the characteristics of the distribution are such that the bias power becomes low in the periphery of the substrate. Moreover, when the bias power is applied with a delay after the $SiH_4$, the bias power becomes even lower in the periphery of the substrate. As a result, the film stress in the SiN film increases, thereby causing the development of blisters and the occurrence of film detachment, particularly in the periphery of the substrate.

Figure 3:
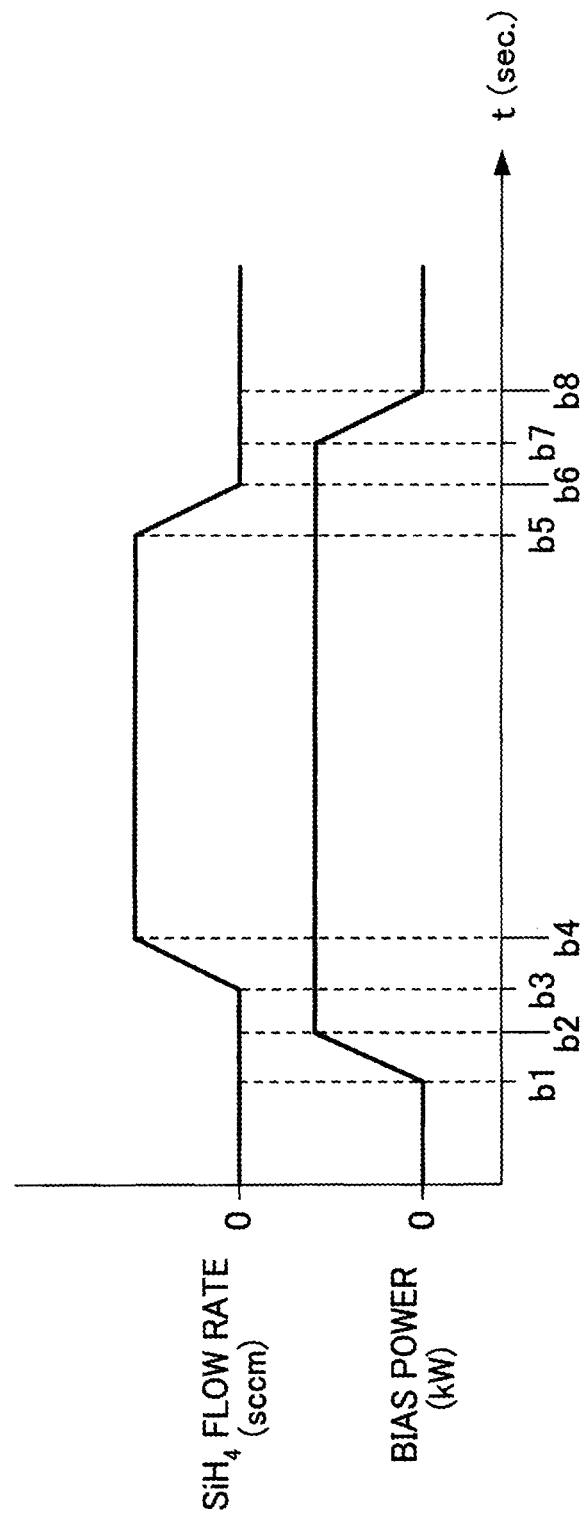
FIG. 3 is a time chart describing an illustrative embodiment (Example 1) of a method for manufacturing a silicon nitride film according to the present invention.

To solve this, this example uses the time chart shown in FIG. 3 so that the SiN film, including the periphery of the substrate, will not be formed in a state where the bias power is low. In this way, the SiN film is formed in a state where desired bias power is certainly applied. This reduces the film stress in the SiN film and thereby suppresses the development of blisters and the occurrence of film detachment.

Now, a method for manufacturing a SiN film of this example will be described with reference to the time chart in FIG. 3. Note that although FIG. 3 too shows only the $SiH_4$ flow rate and the bias power, the gases other than the $SiH_4$, such as the $N_2$ and the Ar, and the RF power are supplied prior to the film formation for generating plasma.

In the method for manufacturing a SiN film of this example, the $SiH_4$ is supplied after applying the bias power so as to shift the timings to start the $SiH_4$ and the bias power from each other. Specifically, as shown in FIG. 3, first, the supply of the bias power is started (time b1) and gradually increased to predetermined bias power (time b2). This predetermined bias power refers to such bias power that the SiN film, including the periphery of the substrate, experiences no increase in film stress and hence no development of blisters or no occurrence of film detachment. In this example, a bias power of 2.7 kW is applied to a 300-mm diameter Si substrate as an example of the predetermined bias power.

Subsequently, after the predetermined bias power is held constant, that is, after the distribution of the bias power within the surface of the substrate becomes stable, the supply of the $SiH_4$ is started (time b3) and gradually increased to a predetermined $SiH_4$ flow rate (time b4). In this example, 115 sccm of $SiH_4$ is supplied as an example of the predetermined $SiH_4$ flow rate. In this example, the film, including the periphery of the substrate, can avoid being formed at low bias power by supplying the SiH$_4$ after the bias power is applied. However, the film, including the periphery of the substrate, can avoid being formed at low bias power more certainly by starting the supply of the SiH$_4$ after the distribution of the bias power becomes stable within the surface of the substrate.

Then, after the film formation is performed for such a period of time that a predetermined film thickness is obtained, the supplies of the SiH$_4$ and the bias power are stopped. Here, the supply of the SiH$_4$ is stopped and then the application of the bias power is stopped, so that the timings to stop the SiH$_4$ and the bias power are shifted from each other as well. Specifically, as shown in FIG. 3, first, the supply of the SiH$_4$ is gradually decreased (time b5), and the supply is stopped by gradually decreasing it until the SiH$_4$ flow rate reaches 0 (time b6).

Lastly, after the SiH$_4$ remaining inside the vacuum chamber 11 is vented, the supply of the bias power is gradually decreased (time b7), and the supply is stopped by gradually decreasing it until the bias power reaches 0 (time b8). Since the bias application is stopped after the residual SiH$_4$ is vented as described above, the film, including the periphery of the substrate, avoids being formed at low bias power. Accordingly, a SiN film having a poor film quality due to the residual SiH$_4$ is prevented from being formed.

By the manufacturing method described above, it is possible to avoid increase in the film stress in the SiN film and hence to suppress the development of blisters and film detachment in the periphery of the substrate. As a result, particles can be reduced.

As a result of measuring the numbers of particles (particle sizes of 0.2 μm and greater) by shifting only the timings to start and stop the SiH$_4$ and the bias power with use of the time chart shown in FIG. 2 and the time chart shown in FIG. 3 while maintaining the other conditions (the SiH$_4$ flow rate, the bias power, and the film thickness of the film formation) the same, the number of particles of this example was found to be 25.6% of that of the conventional example, which was a decrease by approximately ¼. Note that in the time chart shown in FIG. 3, the time difference between each pair of start/stop timings was as follows: b2−b1=5 seconds, b3−b2=2 seconds, b4−b3=4 seconds, b6−b5=4 seconds, b7−b6=4 seconds, and b8−b7=8 seconds.

Example 2

Figure 4:
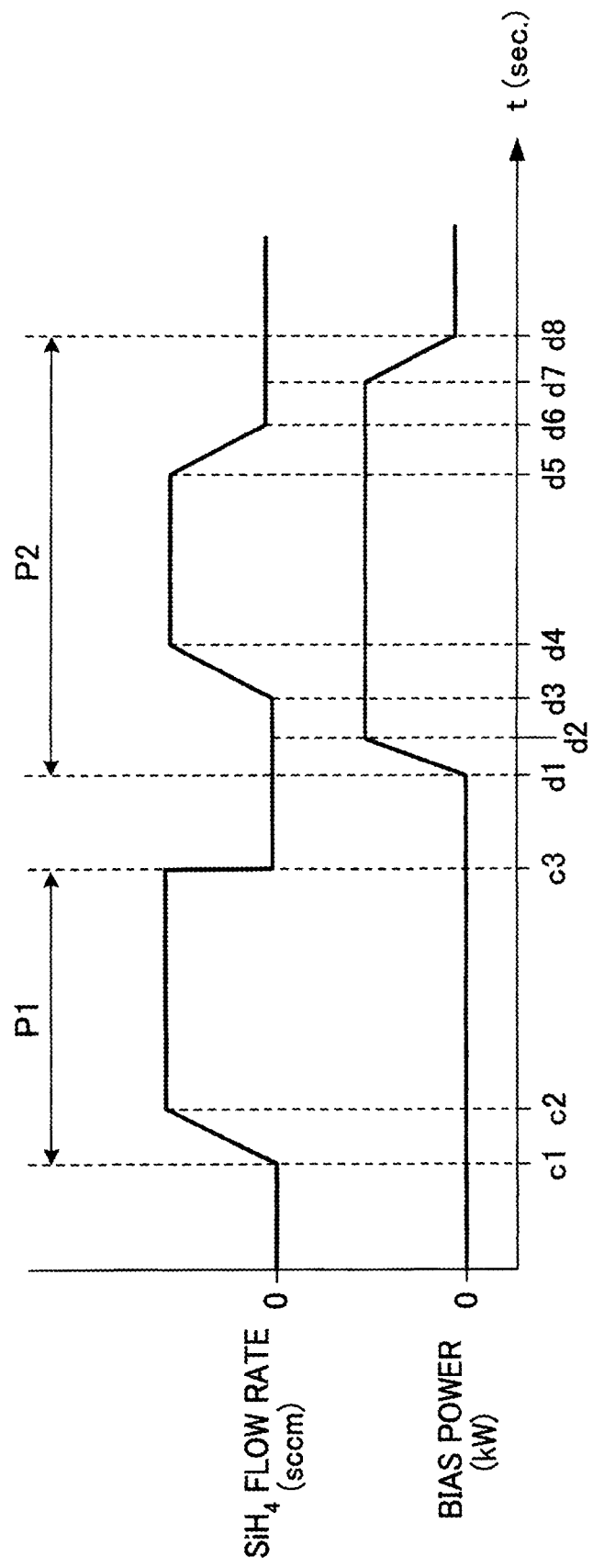
FIG. 4 is a time chart describing another illustrative embodiment (Example 2) of the method for manufacturing a silicon nitride film according to the present invention.

FIG. 4 is a time chart describing a method for manufacturing a SiN film of this example. Note that since the time chart shown in FIG. 4 can be implemented by use of the plasma CVD apparatus shown in FIG. 1 or the like, description of the plasma CVD apparatus itself is omitted in this section.

In this example, like Example 1, a SiN film is formed also by shifting the timings to start and stop the SiH$_4$ and the bias power from each other (process P2). In this example, however, before the process P2 in which the SiN film is formed by applying the bias power, a SiN film involving no application of the bias power is formed (process P1).

Figure 5:
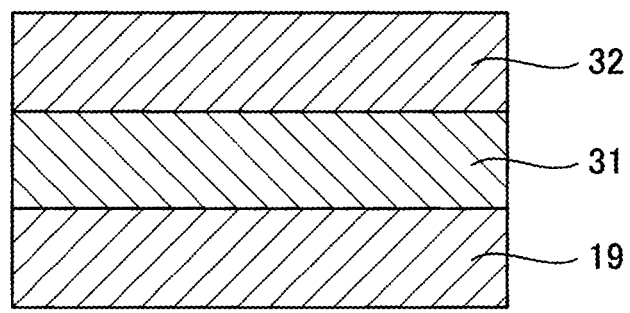
FIG. 5 is a cross-sectional view showing the film structure of a silicon nitride film formed in accordance with the time chart shown in FIG. 4.

This will be described with reference to the time chart in FIG. 4 and the cross-sectional view of the film structure of the SiN film shown in FIG. 5. Note that although FIG. 4 too shows only the SiH$_4$ flow rate and the bias power, the gases other than the SiH$_4$, such as the N$_2$ and the Ar, and the RF power are supplied prior to the film formation for generating plasma.

In the method for manufacturing a SiN film of this example, first, as the process P1, a SiN film 31 involving no application of the bias power (hereinafter, referred to as the unbiased SiN film) is formed on a substrate 19. Specifically, as shown in FIG. 4, the supply of the SiH$_4$ is started (time c1) and gradually increased to a predetermined SiH$_4$ flow rate (time c2) with no bias power being applied. The N$_2$, Ar, and RF power are controlled in synchronization with these timings to control the SiH$_4$. With these process conditions being held constant, the film formation is performed until a predetermined film thickness is obtained, which is until time c3. Thereafter, at the same timing (time c3), the supply of the SiH$_4$ is once stopped.

Note that, as the unbiased SiN film, for example, falling within the following film formation condition can offer later-described properties:

Film formation temperature: 50° C. to 400° C.
RF power with respect to the total flow rate of SiH$_4$ and N$_2$: 7 W/sccm or lower
Gas flow ratio: SiH$_4$/(SiH$_4$+N$_2$)=0.036 to 0.33

Thereafter, as the process P2, a SiN film 32 involving the application of the bias power (hereinafter, referred to as the biased SiN film) is formed on the unbiased SiN film 31. In this process, the timings to start the SiH$_4$ and the bias power are shifted from each other as in Example 1. Specifically, as shown in FIG. 4, first, the supply of the bias power is started (time d1) and gradually increased to predetermined bias power (time d2) as in Example 1. In this example too, a bias power of 2.7 kW is applied to a 300-mm diameter Si substrate as an example of the predetermined bias power.

Subsequently, after the predetermined bias power is held constant, that is, after the distribution of the bias power within the surface of the substrate becomes stable, the supply of the SiH$_4$ is restarted (time d3) and gradually increased to the predetermined SiH$_4$ flow rate (time d4). In this example too, 115 sccm of SiH$_4$ is supplied as an example of the predetermined SiH$_4$ flow rate. In this example too, the film, including the periphery of the substrate, can avoid being formed at low bias power by supplying the SiH$_4$ after the bias power is applied. However, the film, including the periphery of the substrate, can avoid being formed at low bias power more certainly by starting the supply of the SiH$_4$ after the distribution of the bias power becomes stable within the surface of the substrate.

Then, after the film formation is performed for such a period of time that a predetermined film thickness is obtained, the supply of the SiH$_4$ is stopped and then the application of the bias power is stopped as in Example 1, so that the timings to stop the SiH$_4$ and the bias power are shifted from each other as well. Specifically, as shown in FIG. 4, first, the supply of the SiH$_4$ is gradually decreased (time d5), and the supply is stopped by gradually decreasing it until the SiH$_4$ flow rate reaches 0 (time d6).

Lastly, after the SiH$_4$ remaining inside the vacuum chamber 11 is vented, the supply of the bias power is gradually decreased (time d7), and the supply is stopped by gradually decreasing it until the bias power reaches 0 (time d8). Since the bias application is stopped after the residual SiH$_4$ is vented as described above, the film, including the periphery of the substrate, avoids being formed at low bias power. Accordingly, a SiN film having a poor film quality due to the residual SiH$_4$ is prevented from being formed.

By the manufacturing method described above, it is possible to avoid increase in the film stress in the SiN film and hence to suppress the development of blisters and film detachment in the periphery of the substrate. As a result, particles can be reduced.

As mentioned earlier, at the moment of applying the bias power, distribution of the bias power occurs within the surface of the substrate, and the characteristics of the distribution are such that the bias power becomes low in the periphery of the substrate. Further, SiN films are generally high in film stress, and forming such a film directly on the surface of a Si substrate may possibly cause blisters or film detachment in the periphery of the substrate due to the film stress. In this respect, in this example, as shown in FIG. 5, the unbiased SiN film 32 is inserted between the substrate 19 and the biased SiN film 32 as a layer being in tight contact therewith. In this way, increase in the film stress in the SiN film is suppressed, and thereby the development of blisters and film detachment are suppressed. Thus, this example is effective especially when a SiN film is formed directly on the surface of a Si substrate.

The numbers of particles were measured by shifting the timings to start and stop the $SiH_4$ and the bias power with use of the time chart shown in FIG. 2 and the time chart shown in FIG. 4 while maintaining the other conditions (the $SiH_4$ flow rate, the bias power, and the total film thickness of the film formation) the same. Note that the total film thickness of the SiN films formed in accordance with the time chart shown in FIG. 2 was 1000 nm. Moreover, the film thicknesses of the unbiased SiN film 31 and the biased SiN film 32 formed in accordance with the time chart shown in FIG. 4 were 200 nm and 800 nm, respectively, and the total film thickness thereof was 1000 nm. As a result of measuring the numbers of particles (particle sizes of 0.2 μm and greater) in these SiN films, the number of particles of this example was found to be 13.2% of the conventional example, which was a decrease by approximately ⅛. Note that in the time chart shown in FIG. 4, the time difference between each pair of start/stop timings was as follows: d2−d1=5 seconds, d3−d2=2 seconds, d4−d3=4 seconds, d6−d5=4 seconds, d7−d6=4 seconds, and d8−d7=8 seconds.

Example 3

FIG. 6 is a time chart describing a method for manufacturing a SiN film of this example. Note that since the time chart shown in FIG. 6 can also be implemented by use of the plasma CVD apparatus shown in FIG. 1 or the like, description of the plasma CVD apparatus itself is omitted in this section.

In this example, like Example 1, a SiN film is formed also by shifting the timings to start and stop the $SiH_4$ and the bias power from each other (process P12). In this example, however, before the process P12 in which the SiN film is formed by applying the bias power, plasma processing using inert gas is performed to heat a substrate 19 (process P11).

This will be described with reference to the time chart in FIG. 6. Note that although FIG. 6 shows only the $SiH_4$ flow rate and the bias power, the inert gas (Ar) and the RF power are constantly supplied in the process P11 for generating plasma, and the supply of the $N_2$ is started at the same timing as the $SiH_4$ and stopped at the same timing as the $SiH_4$ in the process P12.

In the method for manufacturing a SiN film of this example, first, as the process P11, the substrate 19 is heated by plasma processing using Ar as the inert gas in a state where the bias power is applied. Specifically, as shown in FIG. 6, the supply of the bias power is started (time e1) and gradually increased to predetermined bias power (time e2). With these process conditions being held constant, heating is performed for a desired period of time, which is until time e3. Note that in this example too, a bias power of 2.7 kW is applied to a 300-mm diameter Si substrate as an example of the predetermined bias power, but this may be changed depending on to what temperature the substrate 19 is to be heated. Moreover, in the process P11, Ar is used as the inert gas, but a rare gas other than Ar may be used instead. Furthermore, in the process P11, the substrate may be heated by using only the RF power without using the bias, in which case the time chart of the bias power will be similar to that shown in FIG. 4.

Thereafter, as the process P12, a SiN film involving the application of the bias power is formed on the substrate 19. In this process, since the bias power is already being applied and, further, being stable, the timings to start the $SiH_4$ and the bias power naturally come to be shifted from each other. Specifically, as shown in FIG. 6, the supply of the $SiH_4$ is started (time e3) and gradually increased to a predetermined $SiH_4$ flow rate (time e4). In this example too, 115 sccm of $SiH_4$ is supplied as an example of the predetermined $SiH_4$ flow rate. In this step, the supply of the $N_2$ is started similarly. In this example, the bias power is already being applied in the process P11, and the distribution of the bias power is stable within the surface of the substrate; thus, by starting the supply of the $SiH_4$ after the process P11, the film, including the periphery of the substrate, can avoid being formed at low bias power more certainly.

Then, after the film formation is performed for such a period of time that a predetermined film thickness is obtained, the supply of the $SiH_4$ is stopped and then the application of the bias power is stopped as in Example 1, so that the timings to stop the $SiH_4$ and the bias power are shifted from each other as well. Specifically, as shown in FIG. 6, first, the supply of the $SiH_4$ is gradually decreased (time e5), and the supply is stopped by gradually decreasing it until the $SiH_4$ flow rate reaches 0 (time e6).

Lastly, after the $SiH_4$ remaining inside the vacuum chamber 11 is vented, the supply of the bias power is gradually decreased (time e7), and the supply is stopped by gradually decreasing it until the bias power reaches 0 (time e8). Since the bias application is stopped after the residual $SiH_4$ is vented as described above, the film, including the periphery of the substrate, avoids being formed at low bias power. Accordingly, the film formation of a SiN film having a poor film quality due to the residual $SiH_4$ is prevented.

By the manufacturing method described above, it is possible to avoid increase in the film stress in the SiN film and hence to suppress the development of blisters and film detachment in the periphery of the substrate. As a result, particles can be reduced.

Meanwhile, if gas is released from the substrate 19 during the film formation, that gas release may allow blisters to develop, which in turn causes particles. However, by subjecting the substrate 19 to the heating process before the film formation of the SiN film as described in this example, it is possible to suppress the release of gas (such for example as moisture adhering to the surface of the substrate 19) from the substrate 19 during the film formation. As a result, the development of blisters can be suppressed, and therefore particles can be reduced.

INDUSTRIAL APPLICABILITY

The present invention is applicable to silicon nitride films used in semiconductor elements, and is preferable particularly for the lenses of CCD/CMOS image sensors and the final protection films (passivation) of wirings.

EXPLANATION OF THE REFERENCE NUMERALS 10 plasma CVD apparatus
18 gas supply pipe
19 substrate
26 bias power source
29 master control device unbiased SiN film
32 biased SiN film

The invention claimed is:

1. A method for producing a silicon nitride film to be used in a semiconductor element by performing plasma processing to form the silicon nitride film on a substrate, comprising the step of:
    applying bias to the substrate after generating plasma only using an inert gas,
    starting supply of a raw material gas of the silicon nitride film after the application of the bias, and
    starting a formation of the silicon nitride film.

2. The method for producing a silicon nitride film according to claim 1, further comprising the step of:
    forming a different silicon nitride film with supplying the raw material gas and without applying any bias to the substrate before the formation of the silicon nitride film, wherein
    the supply of the raw material gas is once stopped when the formation of the different silicon nitride film is finished, and
    the bias is applied and then the supply of the raw material gas is restarted for the formation of the silicon nitride film.

3. The method for producing a silicon nitride film according to claim 1, further comprising the step of:
    heating the substrate by plasma processing using an inert gas with applying the bias to the substrate before the formation of the silicon nitride film, wherein
    the supply of the raw material gas is started for the formation of the silicon nitride film in a state where the bias is applied.

4. The method for producing a silicon nitride film according to any one of claims 1 to 3, wherein at the moment of starting the formation of the silicon nitride film, power of the bias is held constant, and then the supply of the raw material gas is started.

5. The method for producing a silicon nitride film according to claim 4, wherein at the moment of finishing the formation of the silicon nitride film, the supply of the raw material gas is stopped, and then the application of the bias is stopped after a residual gas of the raw material gas is vented.

6. The method for producing a silicon nitride film according to any one of claims 1 to 3, wherein at the moment of finishing the formation of the silicon nitride film, the supply of the raw material gas is stopped, and then the application of the bias is stopped after a residual gas of the raw material gas is vented.

* * * * *